(12) United States Patent
Redeker et al.

(10) Patent No.: US 8,053,355 B2
(45) Date of Patent: *Nov. 8, 2011

(54) METHODS AND SYSTEMS FOR LOW INTERFACIAL OXIDE CONTACT BETWEEN BARRIER AND COPPER METALLIZATION

(75) Inventors: Fritz Redeker, Fremont, CA (US); John Boyd, Hillsboro, OR (US); Yezdi Dordi, Palo Alto, CA (US); Hyungsuk Alexander Yoon, San Jose, CA (US); Shijian Li, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/828,082

(22) Filed: Jun. 30, 2010

(65) Prior Publication Data

US 2010/0267229 A1    Oct. 21, 2010

Related U.S. Application Data

(63) Continuation of application No. 11/641,361, filed on Dec. 18, 2006, now Pat. No. 7,749,893.

(51) Int. Cl.
*H01L 21/4763*    (2006.01)
(52) U.S. Cl. ........ 438/627; 438/618; 438/622; 438/643; 438/648
(58) Field of Classification Search .................. None
See application file for complete search history.

(56) References Cited

U.S. PATENT DOCUMENTS

| 7,749,893 B2 * | 7/2010 | Redeker et al. | 438/627 |
| 2004/0192021 A1 * | 9/2004 | Li | 438/622 |

* cited by examiner

*Primary Examiner* — Ha Tran T Nguyen
*Assistant Examiner* — Valerie N Brown
(74) *Attorney, Agent, or Firm* — Larry Williams

(57) ABSTRACT

The present invention relates to methods and systems for the metallization of semiconductor devices. One aspect of the present invention is a method of depositing a copper layer onto a barrier layer so as to produce a substantially oxygen free interface therebetween. In one embodiment, the method includes providing a substantially oxide free surface of the barrier layer. The method also includes depositing an amount of atomic layer deposition (ALD) copper on the oxide free surface of the barrier layer effective to prevent oxidation of the barrier layer. The method further includes depositing a gapfill copper layer over the ALD copper. Another aspect of the present invention is a system for depositing a copper layer onto barrier layer so as to produce a substantially oxygen-free interface therebetween. In one embodiment, the integrated system includes at least one barrier deposition module. The system also includes an ALD copper deposition module configured to deposit copper by atomic layer deposition. The system further includes a copper gapfill module and at least one transfer module coupled to the at least one barrier deposition module and to the ALD copper deposition module. The transfer module is configured so that the substrate can be transferred between the modules substantially without exposure to an oxide-forming environment.

14 Claims, 7 Drawing Sheets

METHODS AND SYSTEMS FOR LOW INTERFACIAL OXIDE CONTACT BETWEEN BARRIER AND COPPER METALLIZATION

CROSS-REFERENCE

This is a continuation application of U.S. patent application Ser. No. 11/641,361, filed Dec. 18, 2006 which is related to U.S. patent application Ser. No. 11/641,364, titled "METHODS AND SYSTEMS FOR BARRIER LAYER SURFACE PASSIVATION," to Yezdi DORDI, John BOYD, Fritz REDEKER, William THIE, Tiruchirapalli ARUNAGIRI, and Alex YOON, filed Dec. 18, 2006 now U.S. Pat. No. 7,749,893; U.S. patent application Ser. No. 11/382,906, filed May 25, 2006; U.S. patent application Ser. No. 11/427,266, filed Jun. 28, 2006; U.S. patent application Ser. No. 11/461,415, filed Jul. 27, 2006; U.S. patent application Ser. No. 11/514,038, filed Aug. 30, 2006; U.S. patent application Ser. No. 10/357,664, filed Feb. 3, 2003; U.S. patent application Ser. No. 10/879,263, filed Jun. 28, 2004; and U.S. patent application Ser. No. 10/607,611, filed Jun. 27, 2003; all of these patents and/or applications are incorporated herein, in their entirety, by this reference.

BACKGROUND

This invention relates to improved methods and systems for the metallization of semiconductor devices such as integrated circuits, memory cells, and the like that use copper metallization; more specifically this invention relates to methods and systems for copper-based metallization of silicon integrated circuits.

An important part of the fabrication of semiconductor devices is the metallization of the devices to electrically interconnect the device elements. For many such devices, the metallization of choice includes the use of copper metal lines. Metallization systems that use copper metal lines also must use a barrier material to isolate the copper from copper sensitive areas of the electronic devices. Some of the barrier layers of interest for copper metallization are materials such as tantalum and such as tantalum nitride. The usual fabrication process for metallization systems that use copper involves the deposition of copper onto the barrier layers. A preferred process for depositing the copper onto the barrier layer is electroless copper deposition.

One problem that occurs in the standard technology used for copper metallization is that many of the preferred barrier materials such as tantalum and tantalum nitride, if exposed to air for extended periods of time, can form oxides such as tantalum oxide and tantalum oxynitride on the surface of the barrier layer. It is known that electroless deposition of copper onto the barrier layer is inhibited if there is oxide present on the barrier layer. In addition, copper does not adhere to the oxide on the barrier layer as well as it adheres to the pure barrier metal or metal rich barrier layer surface, such as tantalum and tantalum-rich surface on tantalum nitride. Tantalum and/or tantalum nitride barrier layers are only presented here as examples; similar problems occur for other barrier layer materials. The poor adhesion can negatively affect the electro-migration performance of the semiconductor devices. In addition, the formation of tantalum oxide or tantalum oxynitride on the barrier layer surface can increase the resistivity of the barrier layer. More specifically, the presence of the oxide between the barrier layer and the composite copper can reduce the performance for the electronic devices and reduce the reliability of the electronic devices fabricated using standard copper metallization technology.

Clearly, there are numerous applications requiring high-performance high reliability electronic devices. The problems that occur for the standard technology for fabricating electronic devices using copper metallization indicate there is a need for methods and systems that can allow the fabrication of electronic devices using copper metallization with improved performance and improved reliability.

SUMMARY

This invention pertains to methods and systems for fabricating semiconductor devices. The present invention seeks to overcome one or more of the deficiencies of the standard technologies for fabricating semiconductor devices such as integrated circuits, memory cells, and the like that use copper metallization.

One aspect of the present invention is a method of depositing a gapfill copper layer onto a transition metal barrier layer or transition metal compound barrier layer for integrated circuit metallization so as to produce a substantially oxygen free interface therebetween. In one embodiment, the method comprises providing a substantially oxide free surface of the barrier layer. The method also includes depositing an amount of atomic layer deposition (ALD) copper on the oxide free surface of the barrier layer effective to prevent oxidation of the barrier layer. The method further includes depositing a gapfill copper layer over the ALD copper.

Another aspect of the present invention is a system for depositing a copper layer onto a transition metal barrier layer or transition metal compound barrier layer for electronic device metallization so as to produce a substantially oxygen-free interface therebetween. In one embodiment, the integrated system comprises at least one barrier deposition module configured to form a barrier layer on a substrate. The system also comprises an ALD copper deposition module configured to deposit copper by atomic layer deposition. The system further includes a copper gapfill module and at least one transfer module coupled to the at least one barrier deposition module and to the ALD copper deposition module. The transfer module is configured so that the substrate can be transferred between the modules substantially without exposure to an oxide-forming environment.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

Figure 1:
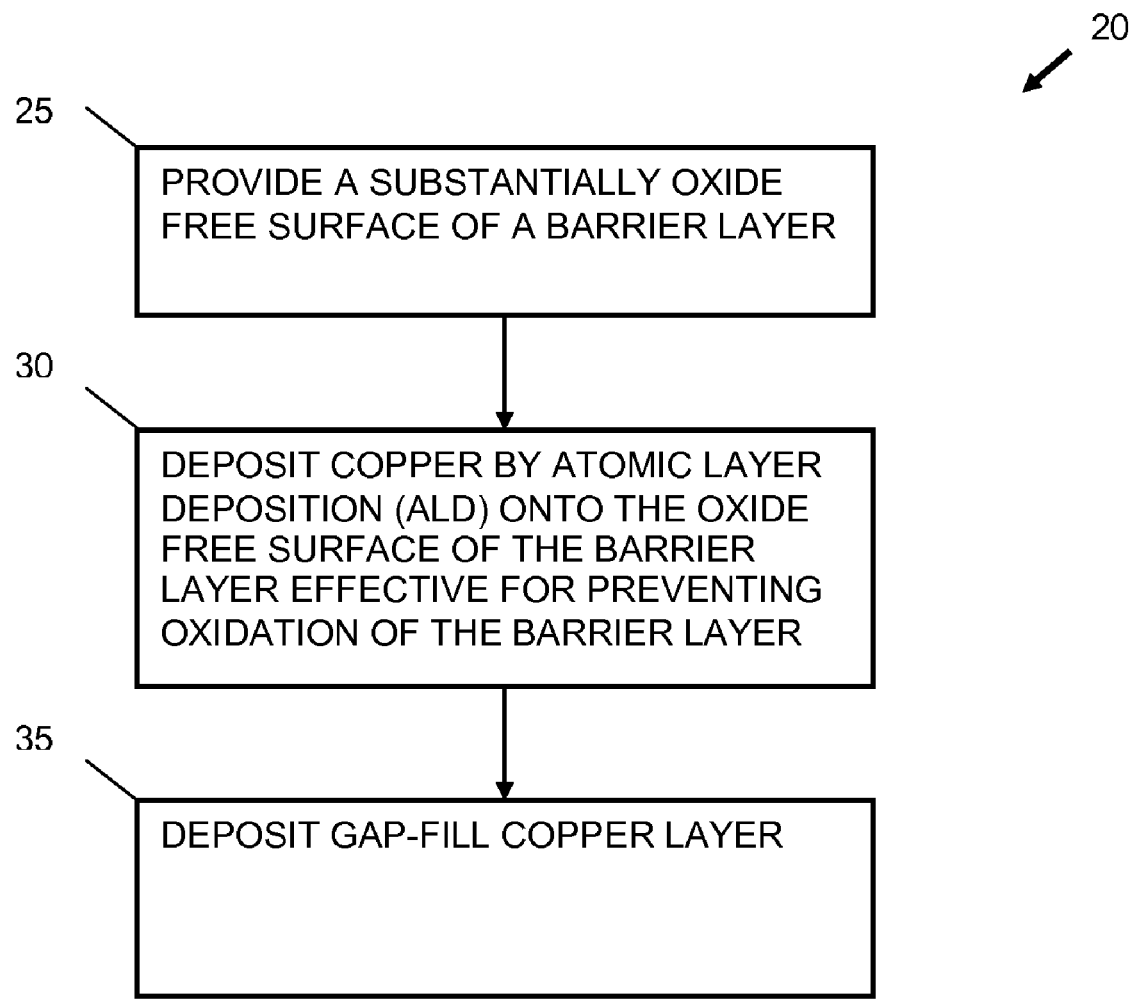
FIG. 1 is a process flow diagram of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to metallization for semiconductor devices using barrier layers and copper lines. The operation of embodiments of the present invention will be discussed below, primarily, in the context of transition metal barrier layers or transition metal compound barrier layers and copper metal lines for silicon integrated circuits. However, it is to be understood that embodiments in accordance with the present invention may be used for other metallization systems for which a substantially oxygen free interface between the barrier layer and metal is needed.

In the following description of the figures, identical reference numerals have been used when designating substantially identical elements or steps that are common to the figures.

Reference is now made to FIG. 1 where there is shown a process flow diagram 20 according to one embodiment of the present invention. Process flow diagram 20 shows a method of depositing a gapfill copper layer onto a transition metal barrier layer or transition metal compound barrier layer for integrated circuit metallization so as to produce a substantially oxygen free interface between the barrier layer and the copper layer. Process flow diagram 20 includes step 25, step 30, and step 35. Step 25 includes formation of a substantially oxide free surface of a barrier layer on a substrate. Step 30 includes deposition of an ALD copper layer onto the substantially oxide free surface of the barrier layer. The ALD copper layer is deposited so as to be effective to substantially prevent oxidation of the barrier layer. Step 35 includes deposition of the gapfill copper layer. Process flow 20 is carried out so that there is substantially no oxide present between the barrier layer and the ALD copper layer. Consequently, the gapfill copper layer is deposited on a substantially oxide-free barrier layer.

Numerous embodiments of the present invention can be obtained as a result of selecting various options for carrying out the steps shown in process flow diagram 20. Step 25 can be performed with a variety of processes such as physical vapor deposition, chemical vapor deposition, and atomic layer deposition. A variety of materials or materials systems can be used for the barrier layer formed in step 25. The material selected for the barrier layer will be a factor influencing the selection of the process used for forming the barrier layer. In a preferred embodiment of the present invention, step 25 involves formation of a barrier layer that includes a transition metal or a transition metal compound. For copper metallization systems, preferred barrier layer materials for embodiments of the present invention are tantalum, tantalum nitride, or a combination of the two. Tantalum and tantalum nitride can be deposited by physical vapor deposition processes. However for preferred embodiments of the present invention, step 25 uses atomic layer deposition to deposit tantalum nitride barrier layers.

A further step (not shown in FIG. 1) that is optional for some embodiments of the present invention includes treating the surface of the barrier layer after the barrier has been formed. Treating the surface of the barrier layer may be performed in a variety of ways. The step is performed so as to prepare the surface of the barrier layer for follow-on processing steps. Treating the surface of the barrier layer is primarily done to improve the surface adhesion or improve the contact resistance for layers deposited on the barrier layer. According to one embodiment of the present invention, treating surface of the barrier layer is accomplished by subjecting the surface of the barrier layer to a hydrogen containing plasma. The hydrogen containing plasma may be configured to remove contaminants on the surface of the barrier layer such as to decompose metal oxides formed on the surface of the barrier layer so as to produce a metal rich surface at the surface of the barrier layer. An example of a suitable hydrogen containing plasma for treating the surface of the barrier layer is described in commonly owned U.S. patent application Ser. No. 11/514,038, filed on Aug. 30, 2006 and is incorporated herein in its entirety by this reference.

As another option, treating the surface of the barrier may include enriching the surface of the barrier layer with a metal such as by depositing the metal onto the surface of the barrier layer. As an option, a process such as a physical vapor deposition process can be used to enrich the surface of the barrier layer with the metal. A preferred method for embodiments of the present invention for treating the surface of the barrier includes depositing a metal using a plasma implantation process to incorporate the metal with the surface of the barrier layer. Preferably, the step of treating the barrier layer surface is performed either as part of step 25 or at another point in the process prior to the deposition of the ALD copper layer. A preferred metal to use to enrich the surface of the barrier layer is a transition metal such as tantalum. It is to be understood that treatment of the barrier layer surface is not required for all embodiments of the present invention.

The general process of atomic layer deposition of copper is well known in the art. There are multiple processes to choose from for the deposition of ALD copper layer for step 30. As stated above, the ALD copper layer for preferred embodiments of the present invention is deposited so as to be effective to substantially prevent oxidation of the barrier layer surface. More specifically, this means that the ALD copper layer is deposited so as to substantially prevent oxidation of the barrier layer during the deposition of the ALD copper layer. This also means that the ALD copper layer is deposited so as to have a suitable combination of thickness and microstructure properties so that diffusion of oxide forming species to the surface of the barrier layer substantially does not occur for follow-on processing. In other words, the ALD copper layer is deposited to act as oxidation protection for the barrier layer. For one embodiment of the present invention, the ALD copper layer has a thickness of about 1 nm to about 2 nm. According to a preferred embodiment of the present invention, the ALD copper layer has a thickness sufficient to prevent oxidation of the underlying barrier layer, and the ALD copper layer has a thickness sufficient so that the ALD copper layer can be used as a copper seed layer for electrochemical plating a copper gapfill layer.

For a preferred embodiment of the present invention, the ALD copper layer is deposited using deposition chemistries that do not include elements or compounds that form a metal oxide with the metal at the barrier layer surface. Exemplary process chemistries for deposition of the ALD copper layer use a precursor copper compound such as (N,N'-diisopropylacetamidinato)copper(1) and such as (N,N'-di-sec-butylacetamidinato)copper(1). Both of these compounds are commercially available from suppliers such as Sigma-Aldrich Corp., St. Louis, Mo. Other examples of suitable process chemistries for the ALD copper deposition are copper(II) (tmhd)$_2$ (tmhd=tetramethyl-3,5-heptanedionate) and copper (I) 1,3-diketiminates.

A variety of processes and process conditions can be used for step 35 of process flow 20. As an option for step 35, electroless deposition can be used to deposit the gapfill copper layer onto the ALD copper layer formed in step 30. In a preferred embodiment, the ALD copper layer formed in step 30 is sufficiently thick to act as a copper seed layer and step 35 includes the deposition of an electroplated copper gapfill layer on the ALD copper layer formed in step 30. Electroless copper deposition and electrochemical plating process are well-known wet processes.

In yet another embodiment of the present invention, process flow 20 further comprises storing the substrate with the ALD copper layer on the barrier layer for an amount of time or transporting the substrate with the ALD copper layer on the barrier layer to a preparation module for preparing the substrate for depositing the gapfill copper layer. This embodiment of the present invention is suitable if the ALD copper layer is capable of protecting the underlying barrier layer from oxide formation during transporting or during storing for which the transporting step or storing are for a long period of time or occur in environmental conditions other than those in a vacuum transfer module or controlled environment transfer module. More particularly, this embodiment of the present invention uses an ALD copper layer that can prevent substantial oxide formation on the underlying barrier layer for extended periods of time or exposure to process conditions that may or may not cause oxide formation, absent the ALD copper layer. In other words, one embodiment of the present invention includes process flow 20 in which the ALD copper layer is configured to prevent substantial oxide formation for the barrier layer for transporting or storing the barrier layer with the ALD copper layer in an oxygen containing environment.

Figure 2:
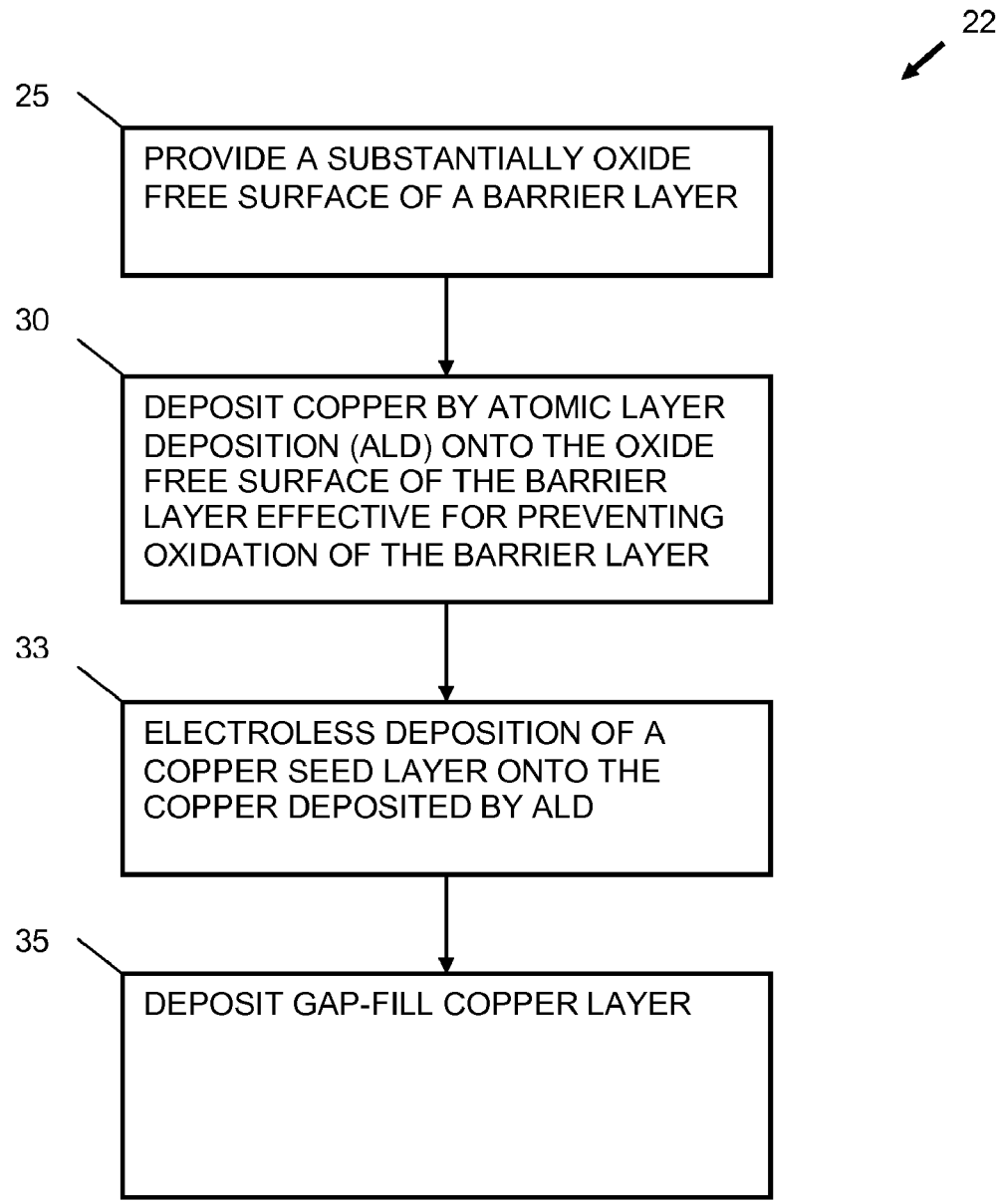
FIG. 2 is a process flow diagram of an embodiment of the present invention.

Reference is now made to FIG. 2 where there is shown a process flow diagram 22 according to one embodiment of the present invention. Process flow diagram 22 shows a method of depositing a gapfill copper layer onto a transition metal barrier layer or transition metal compound barrier layer for integrated circuit metallization so as to produce a substantially oxygen free interface between the barrier layer and the copper layer. Process flow diagram 22 includes step 25, step 30, step 33, and step 35. Step 25 includes formation of a substantially oxide free surface of a barrier layer on a substrate. Step 30 includes deposition of an ALD copper layer onto the substantially oxide free surface of the barrier layer. The ALD copper layer is deposited so as to be effective for substantially preventing oxidation of the barrier layer. Step 33 includes electroless deposition of a copper seed layer onto the ALD copper layer. Step 35 includes deposition of the gapfill copper layer. Process flow 20 is carried out so that there is substantially no oxide present between the barrier layer and the ALD copper layer. Consequently, the copper layer is deposited on an oxide-free surface of the barrier layer.

Numerous embodiments of the present invention can be obtained as a result of selecting various options for the steps shown in process flow diagram 22. Step 25 can be performed using a variety of processes such as physical vapor deposition, chemical vapor deposition, and atomic layer deposition. A variety of materials or materials systems can be used for the barrier layer formed in step 25. The material selected for the barrier layer will be a factor influencing the selection of the process used for forming the barrier layer. In a preferred embodiment of the present invention, step 25 involves formation of a barrier layer that includes a transition metal or a transition metal compound. For copper metallization systems, preferred barrier layer materials for embodiments of the present invention are tantalum, tantalum nitride, or a combination of the two. Tantalum and tantalum nitride can be deposited by physical vapor deposition processes. However for preferred embodiments of the present invention, step 25 uses atomic layer deposition to deposit tantalum nitride barrier layers.

A further step (not shown in FIG. 2) that is optional for some embodiments of the present invention includes treating the surface of the barrier layer after the barrier has been formed. Treating the surface of the barrier layer may be performed in a variety of ways. The step is performed so as to prepare the surface of the barrier layer for follow-on processing steps. Treating the surface of the barrier layer is primarily directed to improve the surface adhesion or improve the contact resistance for layers deposited on the barrier layer. According to one embodiment of the present invention, treating surface of the barrier layer includes subjecting the surface of the barrier layer to a hydrogen containing plasma. The hydrogen containing plasma may be configured to remove contaminants on the surface of the barrier layer such as to decompose metal oxides formed on the surface of the barrier layer so as to produce a metal rich surface at the surface of the barrier layer.

As another option, treating the surface of the barrier may include enriching the surface of the barrier layer with a metal such as by depositing the metal onto the surface of the barrier layer. As an option, a process such as a physical vapor deposition process can be used to enrich the surface of the barrier layer with the metal. A preferred method for embodiments of the present invention for treating the surface of the barrier includes depositing a metal using a plasma implantation process to incorporate the metal with the surface of the barrier layer. Preferably, treating the barrier layer surface is performed either as part of step 25 or at another point in the process prior to the deposition of the ALD copper layer. A preferred metal to use to enrich the surface of the barrier layer is a transition metal such as tantalum. It is to be understood that treating the barrier layer surface is not a required step for all embodiments of the present invention.

The general process of atomic layer deposition of copper is well known in the art. There are multiple processes to choose from for the deposition of ALD copper layer for step 30. As stated above, the ALD copper layer for preferred embodiments of the present invention is deposited so as to be effective to substantially prevent oxidation of the barrier layer surface. More specifically, this means that the ALD copper layer is deposited so as to substantially prevent oxidation of the barrier layer during the deposition of the ALD copper layer. This also means that the ALD copper layer is deposited so as to have a suitable combination of thickness and microstructure properties so that diffusion of oxide forming species to the surface of the barrier layer substantially does not occur for follow-on processing. In other words, the ALD copper layer is deposited to act as oxidation protection for the barrier layer. For one embodiment of the present invention, the ALD copper layer has a thickness of about 1 nm to about 2 nm.

For a preferred embodiment of the present invention, the ALD copper layer is deposited using deposition chemistries that do not include elements or compounds that form a metal oxide with the metal at the barrier layer surface. Exemplary process chemistries for deposition of the ALD copper layer use a precursor copper compound such as (N,N'-diisopropylacetamidinato)copper(1) and such as (N,N'-di-sec-butylacetamidinato)copper(1).

Step 33 includes electroless deposition of a copper seed layer onto the ALD copper layer. The inclusion of step 33 in process flow 22 is necessary for embodiments of the present invention where the ALD copper layer may not be suitable for use as a seed layer for the deposition of the copper gapfill layer. Preferably, step 35 includes deposition of an electroplated copper gapfill layer on the copper seed layer formed in step 33. In other words, a preferred embodiment of the present invention includes deposition of an ALD copper layer so that it is sufficient to prevent oxidation of the underlying barrier layer. The ALD copper layer deposition is followed by deposition of a copper seed layer so that the amount of copper present is sufficient to allow deposition of an electroplated copper gapfill layer.

In yet another embodiment of the present invention, process flow 22 further comprises storing the substrate with the ALD copper layer on the barrier layer for an amount of time, transporting the substrate with the ALD copper layer on the barrier layer to a preparation module to prepare the substrate for deposition of the gapfill copper layer or both. This embodiment of the present invention is suitable if the ALD copper layer is capable of protecting the underlying barrier layer from oxide formation during transporting or during storing for which the transporting step or storing step are for a long period of time or occur in environmental conditions other than those in a vacuum transfer module or controlled environment transfer module. More particularly, this embodiment of the present invention uses an ALD copper layer that prevents substantial oxide formation for the underlying barrier layer for extended periods of time or exposure to process conditions that may or may not cause oxide formation. In other words, one embodiment of the present invention includes process flow 22 in which the ALD copper layer is configured to prevent substantial oxide formation of the barrier layer for transporting or storing the barrier layer with the ALD copper layer in an oxygen containing environment.

Figure 3:
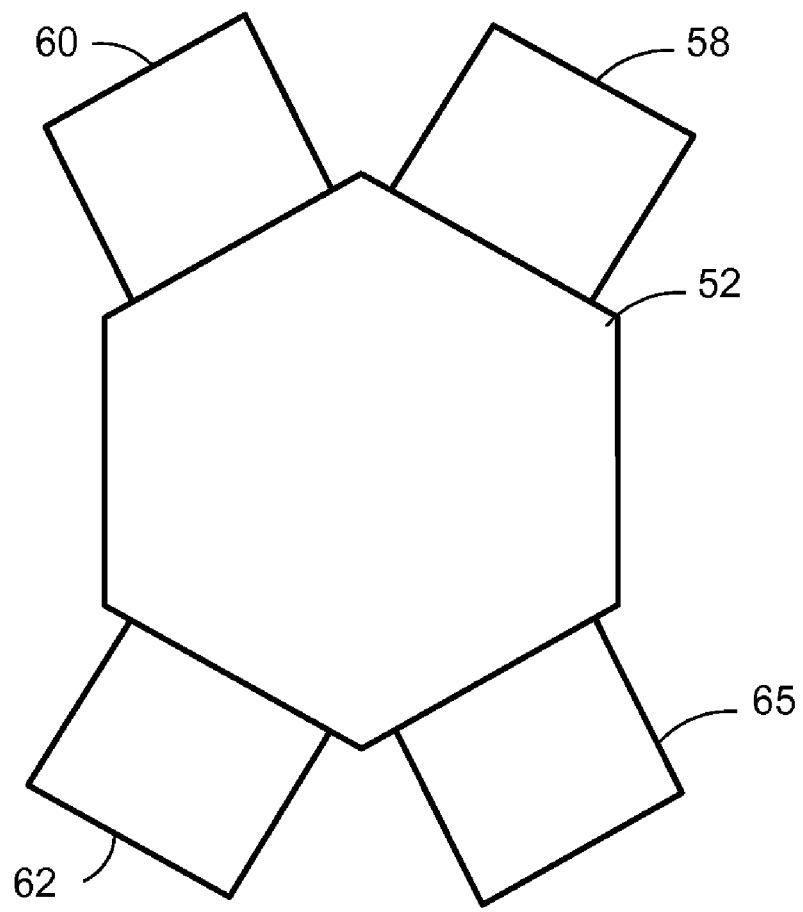
FIG. 3 is a diagram of an embodiment of the present invention.

Reference is now made to FIG. 3 where there is shown a schematic diagram of an exemplary integrated system 50, according to one embodiment of the present invention, for depositing a copper layer onto a transition metal barrier layer or transition metal compound barrier layer on a substrates(s) for integrated circuit metallization. Integrated system 50 is configured so as to produce a substantially oxygen free interface between the barrier layer and the copper layer. A preferred embodiment of integrated system 50 is configured to substantially perform the steps of process flow 20 (FIG. 1) and variations thereof or the steps of process flow 22 (FIG. 2) and variations thereof.

For the embodiment shown in FIG. 3, integrated system 50 comprises at least one transfer module 52, a barrier deposition module 58, a barrier treatment module 60, an ALD copper deposition module 62, and a copper gapfill module 65. Integrated system 50 is configured so that it allows minimal exposure of the substrate surface to oxygen at critical steps for which oxide formation is undesirable. In addition, since it is an integrated system, the substrate can be transferred from one process module immediately to the next station, which limits the duration of exposed to oxygen.

According to one embodiment of the present invention, integrated system 50 is configured to process a substrate(s) through the entire process sequence of process flow 20 of FIG. 1 and variations thereof. More specifically, barrier deposition module 58 is configured to form a barrier layer on a substrate. Preferably, barrier deposition module 58 is configured deposit a barrier layer material such as tantalum, tantalum nitride, and combinations of the two. As an option, barrier deposition module 58 can be configured for physical vapor deposition of the barrier layer or atomic layer deposition of the barrier layer. In a preferred embodiment, barrier deposition module 58 is configured for atomic layer deposition. In one possible configuration, barrier deposition module 58 is configured for an atomic layer deposition process operated at less than 1 Torr. As another option, barrier deposition module 58 is configured for atomic layer deposition for a high-pressure process using supercritical CO2 and organometallic precursors to form the barrier layer. In yet another configuration, barrier deposition module 58 is configured for a physical vapor deposition process operating at pressures less than 1 Torr. Details of an exemplary reactor for a high pressure process using supercritical CO2 is described in commonly assigned application Ser. No. 10/357,664, titled "Method and Apparatus for Semiconductor Wafer Cleaning Using High-Frequency Acoustic Energy with Supercritical Fluid", filed on Feb. 3, 2003, which is in incorporated herein by this reference. Once the barrier layer is formed, the substrate should be transferred in a controlled-ambient environment to limit exposure to oxygen; this is accomplished with transfer module 52.

Barrier treatment module 60 is configured to treat the surface of the barrier layer after formation of the barrier layer. More specifically, barrier treatment module 60 is configured so as to prepare the surface of the barrier layer for follow-on processing steps. Primarily, barrier treatment module 113 is configured to improve the surface adhesion or to improve the contact resistance for layers deposited on the barrier layer. According to one embodiment of the present invention, barrier treatment module 60 includes a plasma chamber configured to subject the surface of the barrier layer to a hydrogen containing plasma so as to remove contaminants on the surface of the barrier layer or decomposed metal oxides formed on the surface of the barrier layer so as to produce a metal rich surface at the surface of the barrier layer. As another option, barrier treatment module 113 is configured to enrich the surface of the barrier layer with a metal such as by depositing the metal onto the surface of the barrier layer. In a preferred configuration, barrier treatment module 113 includes a plasma chamber configured for plasma implantation of a metal. The implanted metal is incorporated with the surface of the barrier layer to produce a metal rich surface for the barrier layer. Preferably the surface of the barrier layer is enriched with a transition metal. For applications using tantalum or tantalum nitride for the barrier layer, barrier treatment module 60 is preferably configured to enrich the surface of the barrier layer surface with tantalum.

ALD copper deposition module 65 is configured to deposit an ALD copper layer under conditions that do not substantially cause oxide formation on a substantially oxide free barrier layer surface or metal enriched barrier layer surface. ALD copper deposition module 65 is configured to deposit a copper layer that is effective for substantially preventing oxidation of the barrier layer surface. More specifically, this means that ALD copper deposition module 65 is configured to deposit a copper layer so as to substantially prevent oxidation of the barrier layer during the deposition of the ALD copper layer. ALD copper deposition module 65 is configured to deposit an ALD copper layer that has a suitable combination of thickness and microstructure properties so that diffusion of oxide forming species to the surface of the barrier layer substantially does not occur for follow-on process conditions.

For a preferred embodiment of the present invention, ALD copper deposition module 65 is configured to use chemistries that do not include elements or compounds that form a metal oxide with the metal at the barrier layer surface. Exemplary ALD copper deposition process chemistries for which ALD copper deposition module 65 is configured include, but not limited to, ALD copper deposition from a precursor copper compound such as (N,N'-diisopropylacetamidinato)copper (1) and ALD copper deposition from a precursor copper compound such as (N,N'-di-sec-butylacetamidinato)copper(1).

Copper gapfill module 65 is configured to deposit a gapfill copper layer. Optionally copper gapfill module 65 can be configured to deposit the gapfill copper layer using electroless deposition, electrochemical plating, or electroless deposition and electrochemical plating. More specifically, copper gapfill module 65 may be configured to deposit a conformal copper seed layer on the barrier surface, followed by a thick copper gapfill (or bulk fill) process. In one embodiment, copper gapfill module 65 is configured to perform an electroless process to produce a conformal copper seed layer. Copper gapfill module 65 can be further configured for a thick copper bulk fill process by an electroless deposition process or an electrochemical plating process. Electroless copper deposition and electrochemical plating process are well-known wet processes. For a wet process to be integrated in a system with controlled processing and transporting environment, which has been described above, the reactor needs to be integrated with a rinse/dryer to enable dry-in/dry-out process capability. In addition, the system needs to be filled with inert gas to ensure minimal exposure of the substrate to oxygen. Further, all fluids used in the process are de-gassed, i.e. dissolved oxygen is removed by commercially available degassing systems.

The environment for electroless deposition also needs to be controlled to provide low (or limited) levels of oxygen and moisture (water vapor). Inert gas can also be used in copper gapfill module 65 to ensure low levels of oxygen are in the processing environment. Copper gapfill module 65 can be configured to perform the electroless deposition process in a number of ways, such as puddle-plating, where fluid is dispensed onto a substrate and allowed to react in a static mode, after which the reactants are removed and discarded, or reclaimed. In another embodiment, copper gapfill module 65 includes a proximity process head to limit the electroless process liquid so that it is only in contact with the substrate surface on a limited region. The substrate surface that is not under the proximity process head is dry. Details of such a process and system can be found in U.S. application Ser. No. 10/607,611, titled "Apparatus And Method For Depositing And Planarizing Thin Films Of Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties.

The at least one transfer module 52 is configured for vacuum transfer of the substrate or controlled environment transfer of the substrate. Alternatively, the at least one transfer module 52 may comprise to transfer modules with one transfer module configured for vacuum transfer and a second transfer module configured for controlled environment transfer. Transfer module 52 is coupled to the barrier deposition module 58, barrier treatment module 60, ALD copper deposition module 62, and copper gapfill module 65. Transfer module 52 is configured so that the substrate can be transferred between the modules substantially without exposure to an oxygen-containing environment or an oxide-forming environment.

Wet processes such as those performed in copper gapfill module 65 typically operated near atmospheric pressure, while the dry processes such as those performed in barrier deposition module 58, barrier treatment module 60, and ALD copper deposition module 62 are usually operated at less than 1 Torr. Therefore, integrated system 50 needs to be able to handle a mixture of dry and wet processes. The least one transfer module 52 is equipped with one or more robots to move the substrate from one process area to another process area. The process area could be a substrate cassette, a reactor, or a loadlock (cassette and loadlock not shown in FIG. 3).

As described above, it is important to control the processing and transport environments to minimize the exposure of the barrier layer surface to oxygen prior to deposition of the ALD copper layer so as to avoid formation of an oxide on the barrier layer. The substrate should be process under a controlled environment, where the environment is either under vacuum or filled with one or more inert gas(es) to limit the exposure of the substrate to oxygen. To provide a controlled environment for substrate transfer, transfer module 52 is configured so that the environment is controlled to be free of oxygen. In one exemplary configuration, transfer module 52 is configured to have inert gas(es) fill the transfer module during substrate transfer. Additionally, all fluids used in the processes are de-gassed, i.e. dissolved oxygen is removed by commercially available degassing systems. Exemplary inert gas(es) includes nitrogen (N2), helium (He), neon (Ne), argon (Ar), krypton (Kr), and xenon (Xe).

Figure 4:
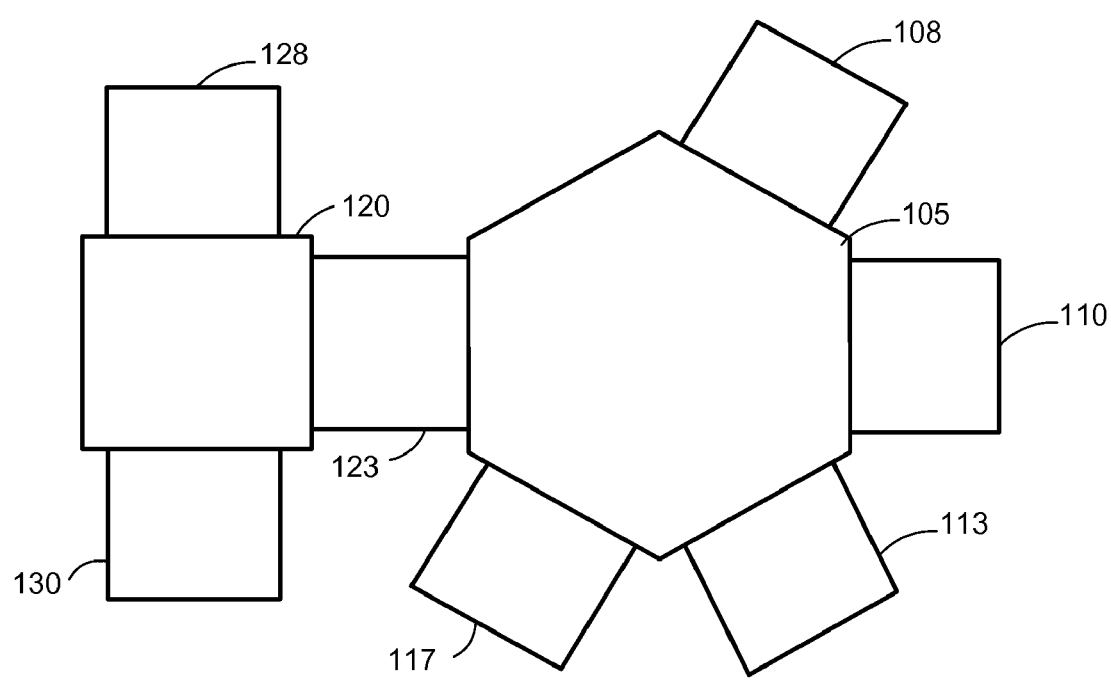
FIG. 4 is a diagram of an embodiment of the present invention.

Reference is now made to FIG. 4 where there is shown a schematic diagram of an exemplary integrated system 75, according to another embodiment of the present invention, for depositing a copper layer onto a transition metal barrier layer or transition metal compound barrier layer on substrates for integrated circuit metallization. Integrated system 75 is configured so as to produce a substantially oxygen free interface between the barrier layer and the copper layer. A preferred embodiment of integrated system 75 is configured to substantially perform the steps of process flow 22 (FIG. 2) and variations thereof or the steps of process flow 22 (FIG. 2) and variations thereof.

Integrated system 75 comprises a vacuum transfer module 105 connected with a barrier deposition module 108, a loadlock 110, a barrier treatment module 113, and an ALD copper deposition module 117. Integrated system 75 also includes a controlled environment transfer module 120 connected with a copper seed deposition module 128, and a copper gapfill module 130. A second loadlock 123 is included in integrated system 75 for joining vacuum transfer module 105 and control environment transfer module 120.

For integrated system 75, barrier deposition module 108 is configured so as to have essentially the same configuration as described above for barrier deposition module 58. Barrier surface cleaning module 113 is configured so as to have essentially the same configuration as described above for barrier surface cleaning module 60. ALD copper deposition module 117 is configured to have essentially the same configuration as described above for ALD copper deposition module 62. Loadlock 110 is provided to allow substrate transfer for vacuum transfer module 105 while maintaining vacuum conditions for vacuum transfer module 105.

Vacuum transfer module 105 is configured for operation under vacuum (<1 Torr). Controlled environment transfer module 120 is configured for operation at around 1 atmosphere pressure. Loadlock 123 is placed between vacuum transfer module 105 and controlled environment transfer module 125 to allow substrate transfer between the two modules operated under different pressures while preserving the integrity of the environments in each transfer module. Loadlock 123 is configured to be operated under vacuum at pressures less than 1 Torr, or at lab ambient, or to be filled with an inert gas selected form a group of inert gases.

Barrier treatment module 113 is configured to treat the surface of the barrier layer after formation of the barrier layer. More specifically, barrier treatment module 113 is configured so as to prepare the surface of the barrier layer for follow-on processing steps. Primarily, barrier treatment module 113 is configured to improve the surface adhesion or to improve the contact resistance for layers deposited on the barrier layer. According to one embodiment of the present invention, barrier treatment module 113 includes a plasma chamber configured to subject the surface of the barrier layer to a hydrogen containing plasma so as to remove contaminants on the surface of the barrier layer or decomposed metal oxides formed on the surface of the barrier layer so as to produce a metal rich surface at the surface of the barrier layer. As another option, barrier treatment module 113 is configured to enrich the surface of the barrier layer with a metal such as by depositing the metal onto the surface of the barrier layer. In a preferred configuration, barrier treatment module 113 includes a plasma chamber configured for plasma implantation of a metal. The implanted metal is incorporated with the surface of the barrier layer to produce a metal rich surface for the barrier layer.

ALD copper deposition module 117 is configured to deposit an ALD copper layer under conditions that do not substantially cause oxide formation on a substantially oxide free barrier layer surface or metal enriched barrier layer surface. ALD copper deposition module 117 is configured to deposit a copper layer that is effective for substantially preventing oxidation of the barrier layer surface. More specifically, this means that ALD copper deposition module 117 is configured to deposit a copper layer so as to substantially prevent oxidation of the barrier layer during the deposition of the ALD copper layer. ALD copper deposition module 117 is configured to deposit an ALD copper layer that has a suitable combination of thickness and microstructure properties so that diffusion of oxide forming species to the surface of the barrier layer substantially does not occur.

For a preferred embodiment of the present invention, ALD copper deposition module 117 is configured to use chemistries that do not include elements or compounds that form a metal oxide with the metal at the barrier layer surface. Exemplary ALD copper deposition process chemistries for which ALD copper deposition module 117 is configured include, but are not limited to, ALD copper deposition from a precursor copper compound such as (N,N'-diisopropylacetamidinato)copper(1) and ALD copper deposition from a precursor copper compound such as (N,N'-di-sec-butylacetamidinato)copper(1).

Copper seed deposition module 128 is configured to deposit a conformal copper seed layer on the ALD copper deposition layer. Preferably, copper seed deposition module 128 is configured for an electroless process to produce the copper seed layer. Copper gapfill module 130 is configured for a thick copper gapfill process by an electroless deposition process or an electrochemical plating process. As stated above, electroless copper deposition and electrochemical plating are well-known wet processes. For a wet process to be integrated in a system with controlled processing and transporting environment, which has been described above, the reactor needs to be integrated with a rinse/dryer to enable dry-in/dry-out process capability. In addition, the system needs to be filled with inert gas to ensure minimal exposure of the substrate to oxygen. Further, all fluids used in the process are de-gassed, i.e. dissolved oxygen is removed by commercially available degassing systems.

Wet processes such as those performed in copper seed deposition module 128 and copper gapfill module 130 are typically operated near atmospheric pressure, while the dry processes such as those performed in barrier deposition module 108, ALD copper deposition module 117, and barrier treatment module 113 are usually operated at less than 1 Torr. Therefore, integrated system 75 needs to be able to handle a mixture of dry and wet processes. Vacuum transfer module 105 and controlled environment transfer module 120 are equipped with one or more robots to move the substrate from one process area to another process area. The process area could be a substrate cassette, a reactor, or a loadlock (cassette not shown in FIG. 4).

Figure 5:
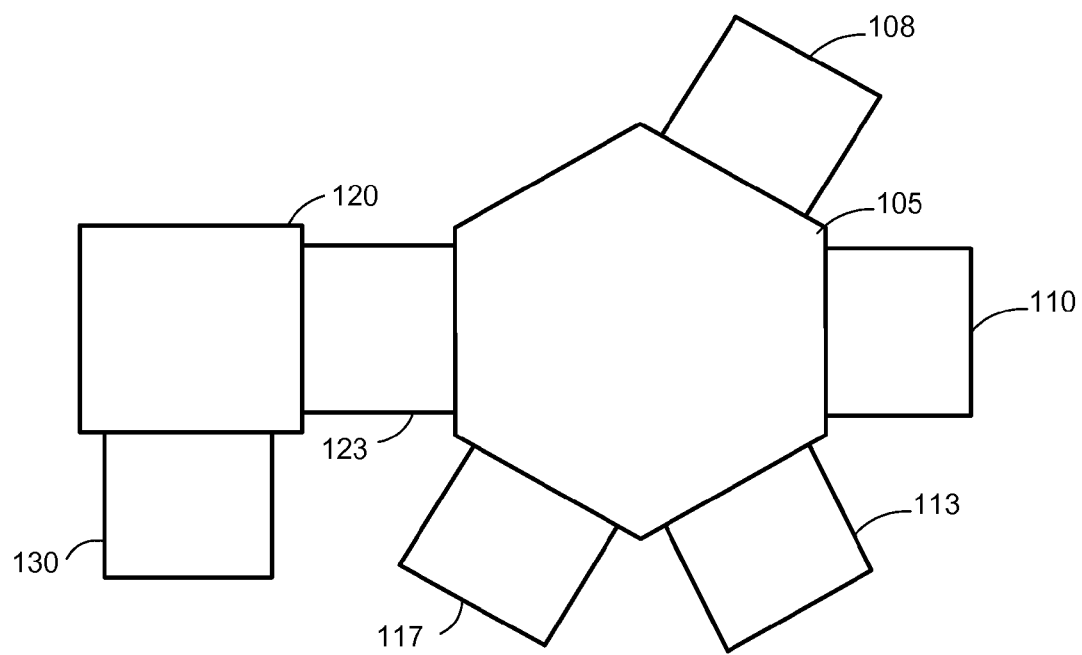
FIG. 5 is a diagram of an embodiment of the present invention.

Reference is now made to FIG. 5 where there is shown a schematic diagram of an exemplary integrated system 75A, according to another embodiment of the present invention, for depositing a copper layer onto a transition metal barrier layer or transition metal compound barrier layer on substrates for integrated circuit metallization. Integrated system 75A is configured so as to produce a substantially oxygen free interface between the barrier layer and the copper layer. A preferred embodiment of integrated system 75A is configured to substantially perform the steps of process flow 20 (FIG. 1) and variations thereof.

Integrated system 75A comprises a vacuum transfer module 105 connected with a barrier deposition module 108, a loadlock 110, a barrier treatment module 113, and an ALD copper deposition module 117. Integrated system 75A also includes a controlled environment transfer module 120 connected with a copper gapfill module 130. A second loadlock 123 is included in integrated system 75A for joining vacuum transfer module 105 and control environment transfer module 120.

Integrated system 75A is essentially the same as integrated system 75 described for FIG. 4 with the exception that integrated system 75A is configured so that ALD copper deposition module 117 produces an ALD copper layer that is effective for preventing oxidation of the underlying barrier layer and is also effective as a copper seed layer. This means that integrated system 75A does not require an electroless copper deposition module. Integrated system 75A is configured to deposit the gapfill copper layer onto the ALD copper layer.

Figure 6:
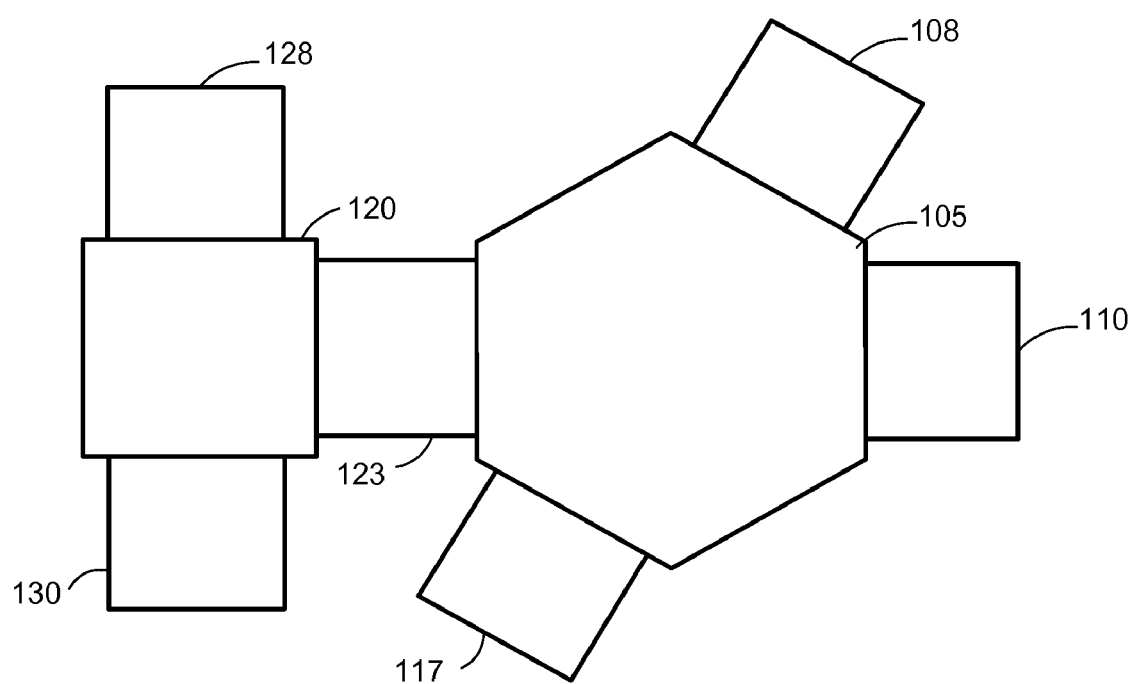
FIG. 6 is a diagram of an embodiment of the present invention.

Reference is now made to FIG. 6 where there is shown a schematic diagram of an exemplary integrated system 75B, according to another embodiment of the present invention, for depositing a copper layer onto a transition metal barrier layer or transition metal compound barrier layer on substrates for integrated circuit metallization. Integrated system 75B is configured so as to produce a substantially oxygen free interface between the barrier layer and the copper layer. A preferred embodiment of integrated system 75B is configured to substantially perform the steps of process flow 22 (FIG. 2) and variations thereof.

Integrated system 75B comprises a vacuum transfer module 105 connected with a barrier deposition module 108, a loadlock 110, and an ALD copper deposition module 117. Integrated system 75B also includes a controlled environment transfer module 120 connected with a copper seed deposition module 128, and a copper gapfill module 130. A second loadlock 123 is included in integrated system 75B for joining vacuum transfer module 105 and control environment transfer module 120.

Integrated system 75B is essentially the same as integrated system 75 described for FIG. 4 with the exception that integrated system 75B does not include a separate module to treat the barrier layer surface to remove oxide or metal enrich the surface. For some applications of embodiments of the present invention, barrier layer treatment may not be necessary. Alternatively, further embodiments of the present invention may be configured so that the barrier layer can be treated in, as an example, the barrier layer formation module or in, as another example, the ALD copper deposition module.

Figure 7:
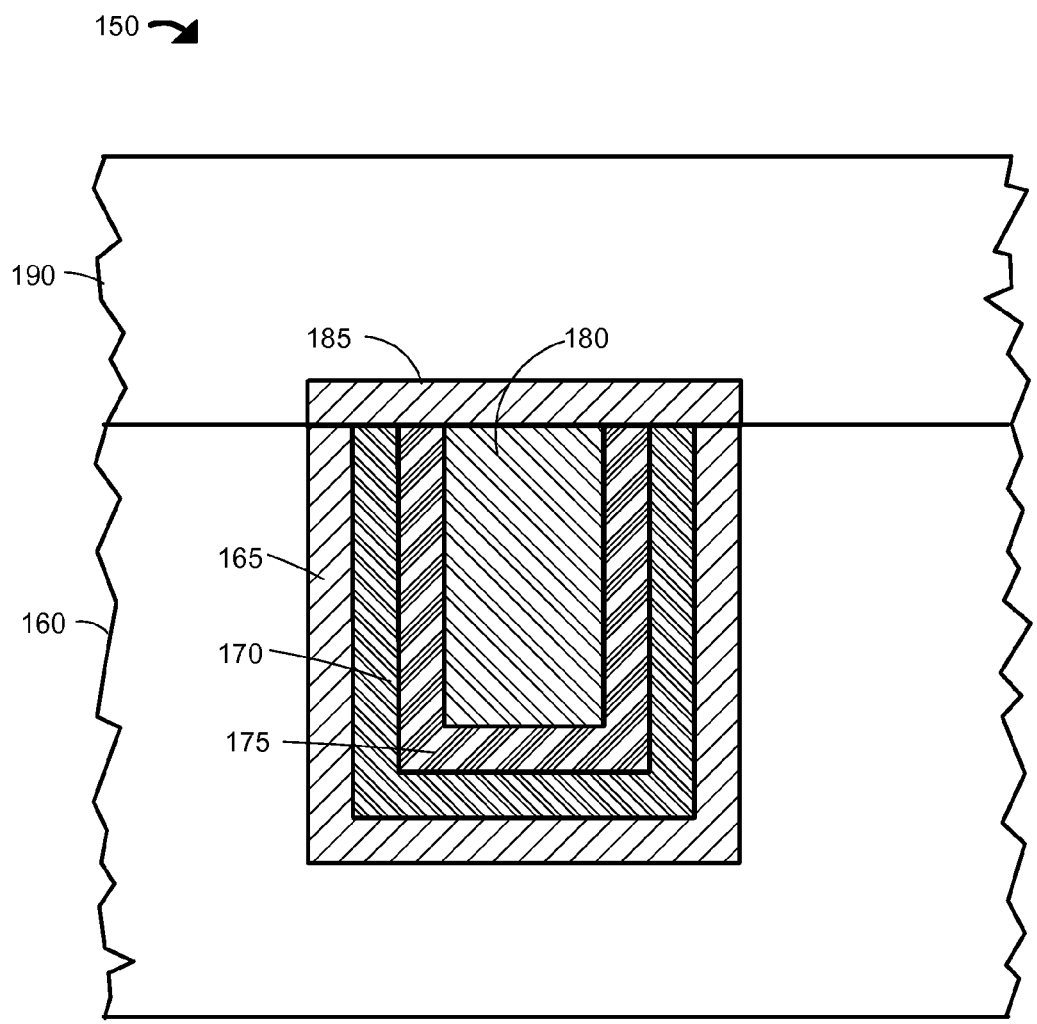
FIG. 7 is a diagram of an embodiment of the present invention.

Reference is now made to FIG. 7 where there is shown a cross-section side view of a portion of copper metallization in an integrated circuit 150 according to one embodiment of the present invention. Integrated circuit 150 includes a semiconductor 155 with integrated circuit elements formed therein (circuit elements not shown in FIG. 7) and a dielectric layer 160 on the semiconductor. The integrated circuit elements are electrically connected with metallization lines. Dielectric 160 has a trench for containing the metallization lines. Integrated circuit 150 further includes a barrier layer 165 lining the bottom and sides of the trench, an ALD copper layer 170 on barrier layer 165, a copper seed layer 175 on ALD copper layer 170, and a copper gapfill layer 180 grown from copper seed layer 175 and completing the copper portion of the metallization. The top of the trench is sealed with a second barrier layer 185 and more dielectric 190. Second barrier layer 185 may be a selective metallic barrier layer such as a barrier layer made of tantalum, tantalum nitride, or a tantalum nitride and tantalum layer combined, cobalt tungsten (CoW), cobalt tungsten borophosphide (CoWBP), and ruthenium. Alternatively, barrier layer 185 may be an electrically insulating barrier material such as silicon carbide, silicon nitride or silicon carbonitride, or a hybrid of both selective metal barrier and non-selective dielectric barrier. Second dielectric layer 190 may comprise the same material as dielectric 160 or it may comprise a material different from dielectric 160.

Persons of ordinary skill in the art will know that seed layer 170 is optional for embodiments of the present invention with a sufficiently thick ALD copper layer. More specifically, ALD copper layer 170 is made thick enough for some embodiments of the present invention to serve as a seed layer for electrochemical plating of copper gapfill layer 180.

Integrated circuit 150 includes a substantially oxide free interface between barrier layer 165 and ALD copper layer 170. A preferred embodiment includes barrier layer 165 having a transition metal rich surface at the interface with ALD copper layer 170. The oxide free interface between barrier layer 165 and ALD copper layer 170 is accomplished with ALD copper deposition process chemistries that do not use oxygen or oxygen containing chemicals. Examples of two suitable process chemistries for deposition of ALD copper layer 170 were given above.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. A method of manufacturing a semiconductor device having copper metallization and a transition metal barrier layer or transition metal compound barrier layer so as to produce a substantially oxygen free interface between the barrier layer and the copper metallization, the method comprising:
    (a) providing a substantially oxide free surface of the barrier layer;
    (b) depositing an amount of ALD copper onto the oxide free surface of the barrier layer effective for preventing oxidation of the barrier layer; and
    (c) electroplating a gapfill copper layer onto the amount of copper.

2. The method of claim 1, further comprising electroless deposition of a copper seed layer onto the ALD copper, prior to electroplating the gapfill copper.

3. The method of claim 1, further comprising a least one of:
    1. storing the substrate with the ALD copper for an amount of time and
    2. transporting the substrate with the ALD copper.

4. The method of claim 1, wherein depositing the ALD copper excludes oxygen compounds or oxygen.

5. The method of claim 3, wherein storing the substrate with the ALD copper for an amount of time and transporting the substrate with the ALD copper occur in an oxygen-containing environment.

6. The method of claim 3, wherein storing the substrate with the ALD copper for an amount of time and transporting the substrate with the ALD copper occur in a substantially non-oxygen containing environment.

7. The method of claim 1, wherein providing the substantially oxide free surface of the barrier layer includes atomic layer deposition of the barrier layer.

8. The method of claim 1, wherein providing the substantially oxide free surface of the barrier layer includes atomic layer deposition of tantalum or tantalum nitride.

9. The method of claim 1, wherein providing the substantially oxide free surface of the barrier layer includes atomic layer deposition of tantalum nitride and depositing the amount of ALD copper is accomplished with
    copper(I) 1,3-diketiminates,
    (N,N'-diisopropylacetamidinato)copper(1), or
    (N,N'-di-sec-butylacetamidinato)copper(1).

10. The method of claim 1, wherein providing the substantially oxide free surface of the barrier layer is accomplished by atomic layer deposition of tantalum nitride for the barrier layer and treatment of the barrier layer surface in a hydrogen containing plasma.

11. The method of claim 1, wherein providing the substantially oxide free surface of the barrier layer is accomplished by atomic layer deposition of tantalum nitride for the barrier layer and treatment of the barrier layer surface in a hydrogen containing plasma; the method further comprising electroless deposition of a copper seed layer onto the ALD copper.

12. The method of claim 1, wherein providing the substantially oxide free surface of the barrier layer includes enriching the surface of the barrier layer with a transition metal.

13. The method of claim 1, wherein providing the substantially oxide free surface of the barrier layer includes enriching the surface of the barrier layer with tantalum.

14. The method of claim 1, wherein the barrier layer comprises tantalum or tantalum nitride.

\* \* \* \* \*